United States Patent
Chang et al.

(10) Patent No.: US 12,543,513 B2
(45) Date of Patent: Feb. 3, 2026

(54) HIGH-FREQUENCY, LOW-VOLTAGE SWITCH DEVICES AND METHODS OF MANUFACTURING THEREOF

(71) Applicant: Taiwan Semiconductor Manufacturing Company, Ltd., Hsinchu (TW)

(72) Inventors: Kuo-Pin Chang, Hsinchu (TW); Hung-Ju Li, Hsinchu (TW); Yu-Wei Ting, Hsinchu (TW); Kuo-Ching Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 492 days.

(21) Appl. No.: 18/298,132

(22) Filed: Apr. 10, 2023

(65) Prior Publication Data

US 2024/0341204 A1 Oct. 10, 2024

(51) Int. Cl.
*H10N 70/20* (2023.01)
*H10N 70/00* (2023.01)

(52) U.S. Cl.
CPC ......... *H10N 70/231* (2023.02); *H10N 70/011* (2023.02); *H10N 70/823* (2023.02); *H10N 70/8413* (2023.02); *H10N 70/8828* (2023.02)

(58) Field of Classification Search
CPC .................................................. H10N 70/00
See application file for complete search history.

(56) References Cited

U.S. PATENT DOCUMENTS

| | | |
|---|---|---|
| 8,030,128 B1 | 10/2011 | Sutardja et al. |
| 8,049,196 B2 | 11/2011 | Jung |
| 9,934,922 B2 | 4/2018 | Reig et al. |
| 10,490,374 B2 | 11/2019 | Borodulin et al. |
| 2010/0188892 A1 | 7/2010 | Baks |
| 2014/0264230 A1 | 9/2014 | Borodulin et al. |
| 2019/0115391 A1 | 4/2019 | Nardi et al. |
| 2022/0284958 A1 | 9/2022 | Cohen et al. |

OTHER PUBLICATIONS

Office Action issued in connection with Taiwan Appl. No. 112119967 dated May 16, 2024.

*Primary Examiner* — Marvin Payen
(74) *Attorney, Agent, or Firm* — FOLEY & LARDNER LLP

(57) ABSTRACT

A semiconductor device includes a first film, a second film, and a third film that each include a phase change material (PCM) and are arranged with respect to one another along a first lateral direction. The semiconductor device includes a first metal pad, a second metal pad, a third metal pad, and a fourth metal pad. The first and second metal pads are disposed over ends of the first film, respectively, the second and third metal pads are disposed over ends of the second film, respectively, and the third and fourth metal pads are disposed over ends of the third film, respectively. The semiconductor device includes a first heater, a second heater, and a third heater, respectively disposed below the first film, the second film, and the third film.

20 Claims, 10 Drawing Sheets

IL = Signal loss in ON-state
IS = Attenuation of undesired signal in OFF-state

HIGH-FREQUENCY, LOW-VOLTAGE SWITCH DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
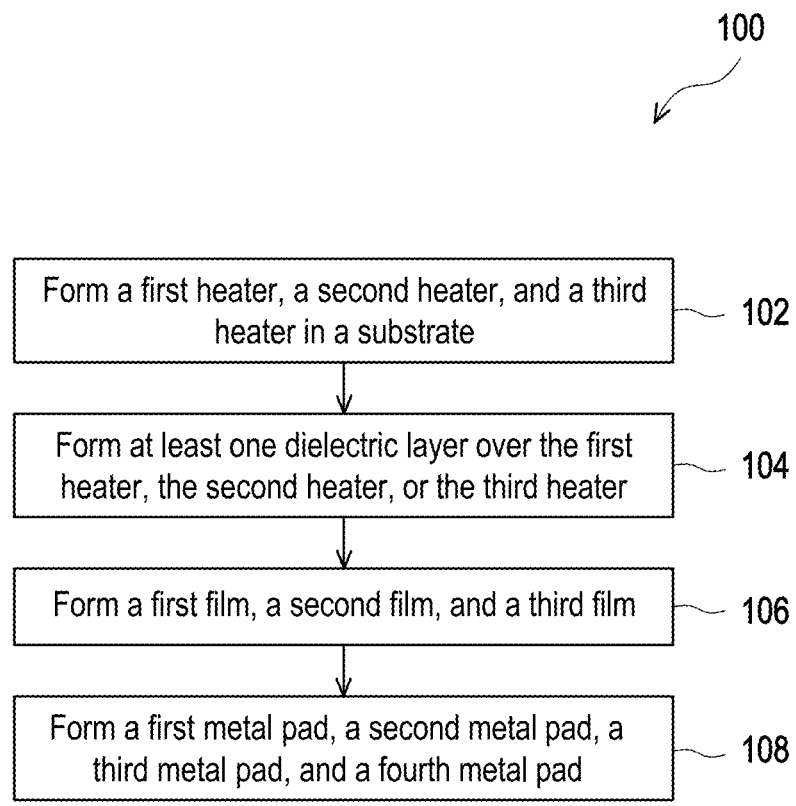
FIG. 1 is a flowchart of an example method for fabricating parallel shunt phase-change material (PCM) radio-frequency switch devices, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of radio frequency (RF) switching circuits using semiconductor manufacturing techniques involving phase-change material (PCM). PCM changes its electrical characteristics (e.g., resistance, capacitance, etc.) in response to changing external conditions, such as temperature or pressure. The example PCM circuits described herein utilize a heater material that is formed adjacent to a PCM material, to form a high-frequency PCM switching circuit. Because the PCM has variable resistance depending on its phase, certain types of PCM can serve as electrical isolators (e.g., a switch "off" state) or electrical conductors (e.g., a switch "on" state). These material properties can be utilized to create various embodiments of parallel RF switching circuitry, as described herein.

Various approaches to PCM switches have certain tradeoffs between device performance and write voltage. In such approaches, low on-resistance is needed to achieve performance, which increases the necessary dimensions of said PCM switches while simultaneously increasing the heater length and write voltage due to large resistance loading. Moreover, such approaches have inconsistent heater reliability due to the increased heater length and non-uniform thermal profile during write operations. While high-voltages may be utilized, high-voltage operations introduce increased complexity when implemented with low-voltage logical circuits (e.g., integration of high-voltage PCM switches with low-voltage logical circuitry may be impracticable). Approaches with parallel switches tend to suffer from increased electrical complexity and area usage.

The various embodiments described herein address these issues by providing a shunt PCM RF switching circuit with low on-resistance that can operate under low voltages. One or more embodiments utilize parallel PCM portions with common overlapping pads. The heaters for the PCM portions can share pads. The on-resistance (sometimes referred to herein as "RON" and off-capacitance (sometimes referred to herein as "COFF") can be tunable by adjusting the size of each shunt device. Further, each parallel shunt device can be tuned independently to achieve desired electrical characteristics. The parallel shunt structure of the devices described herein enables various embodiments to be operated at low voltages, which enables integration with low-voltage logical circuitry. Variable numbers of parallel shunt devices, each with dimensions selected to tune to an achieved RON and COFF can be utilized in connection with the present techniques. Overall area of the parallel shunt design is reduced by utilizing common pads between each shunt device. The common pads further simplify the electrical operations of the shunt devices in read and write modes.

FIG. 1 illustrates a flowchart of an example method 100 for fabricating parallel shunt PCM RF switch devices (e.g., the devices described in connection with FIGS. 4 and 5, etc.), in accordance with one or more embodiments. It is noted that the method 100 is merely an example, and is not intended to limit the present disclosure. Accordingly, it is understood that additional operations may be provided before, during, and after the method 100 of FIG. 1, and that some other operations may only be briefly described herein. Additionally, operations of the method 100 may be performed in an order different from that described herein to achieve desired results. In some embodiments, operations of the method 100 may be described in connection with the perspective and cross-sectional views of the elements and devices shown in FIGS. 2A, 2B, 3A, 3B, 3C, 3D, 4, and 5, which will be discussed in further detail below.

In brief overview, the example method 100 starts with operation 102 of forming a first heater, a second heater, and a third heater on a substrate. The method 100 continues to operation 104, which includes forming at least one dielectric material over the first heater, the second heater, or the third heater. The method 100 continues to operation 106, which includes forming a first film, a second film, and third film. The method 100 continues to operation 108, which includes forming a first metal pad, a second metal pad, a third metal pad, and a fourth metal pad. As mentioned above, FIGS. 4 and 5 illustrate, in various cross-sectional and perspective views, example shunt PCM devices that can be fabricated using the techniques described in connection with method 100 of FIG. 1.

Figure 2A:
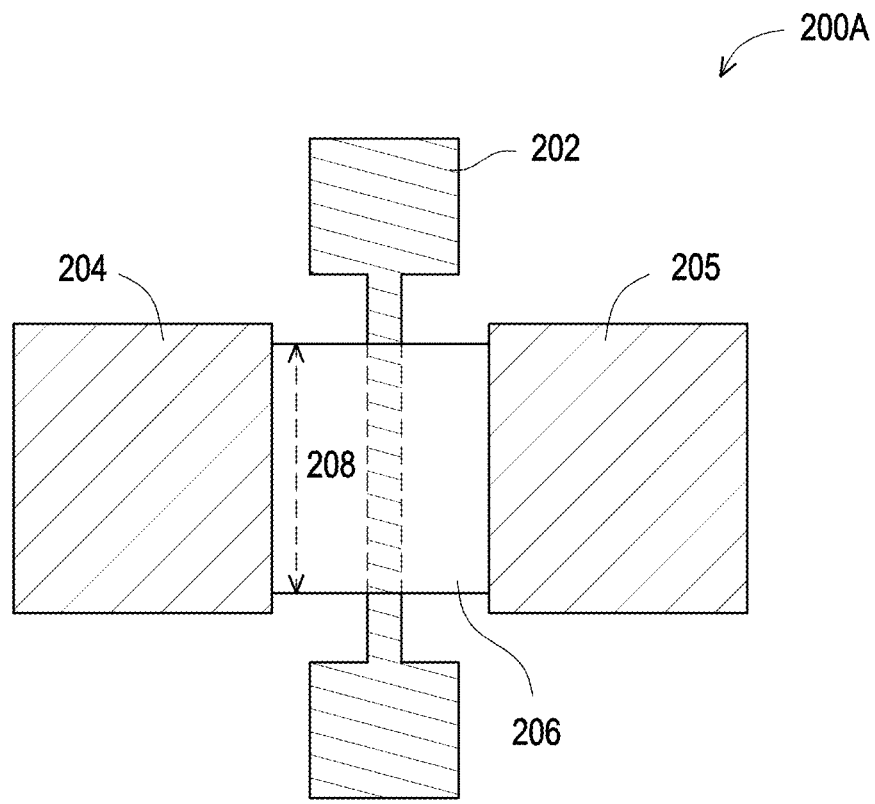
FIGS. 2A and 2B illustrate top and cross-sectional views, respectively, of an example element of a shunt PCM device, in accordance with some embodiments.
Figure 2B:
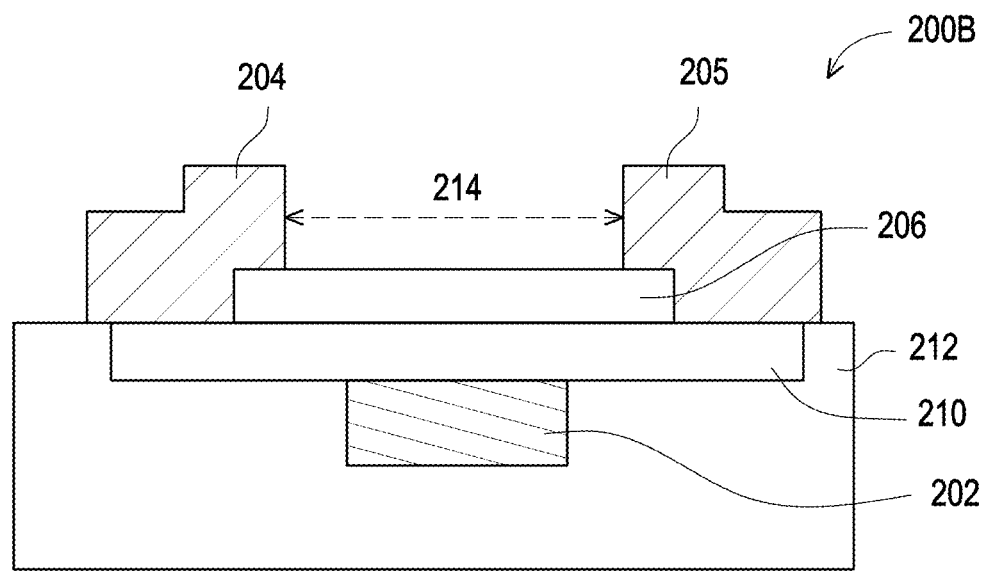

At operation 102, the method 100 includes forming a first heater, a second heater, and a third heater on a substrate. A cross-sectional view 200B of a single element of a parallel shunt PCM RF switch device is shown in FIG. 2B, which shows the heater 202 defined within the substrate 212. Similar techniques may be utilized to form each of the heaters of a shunt PCM device with many elements, such as the PCM devices described in connection with FIGS. 4 and 5. The substrate 212 may be a semiconductor substrate, such as a bulk semiconductor, a semiconductor-on-insulator (SOI) substrate, or the like, which may be doped (e.g., with a p-type or an n-type dopant) or undoped. The substrate 212 may be a wafer, such as a silicon wafer.

An SOI substrate can include a layer of a semiconductor material formed on an insulator layer (not shown). The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 212 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
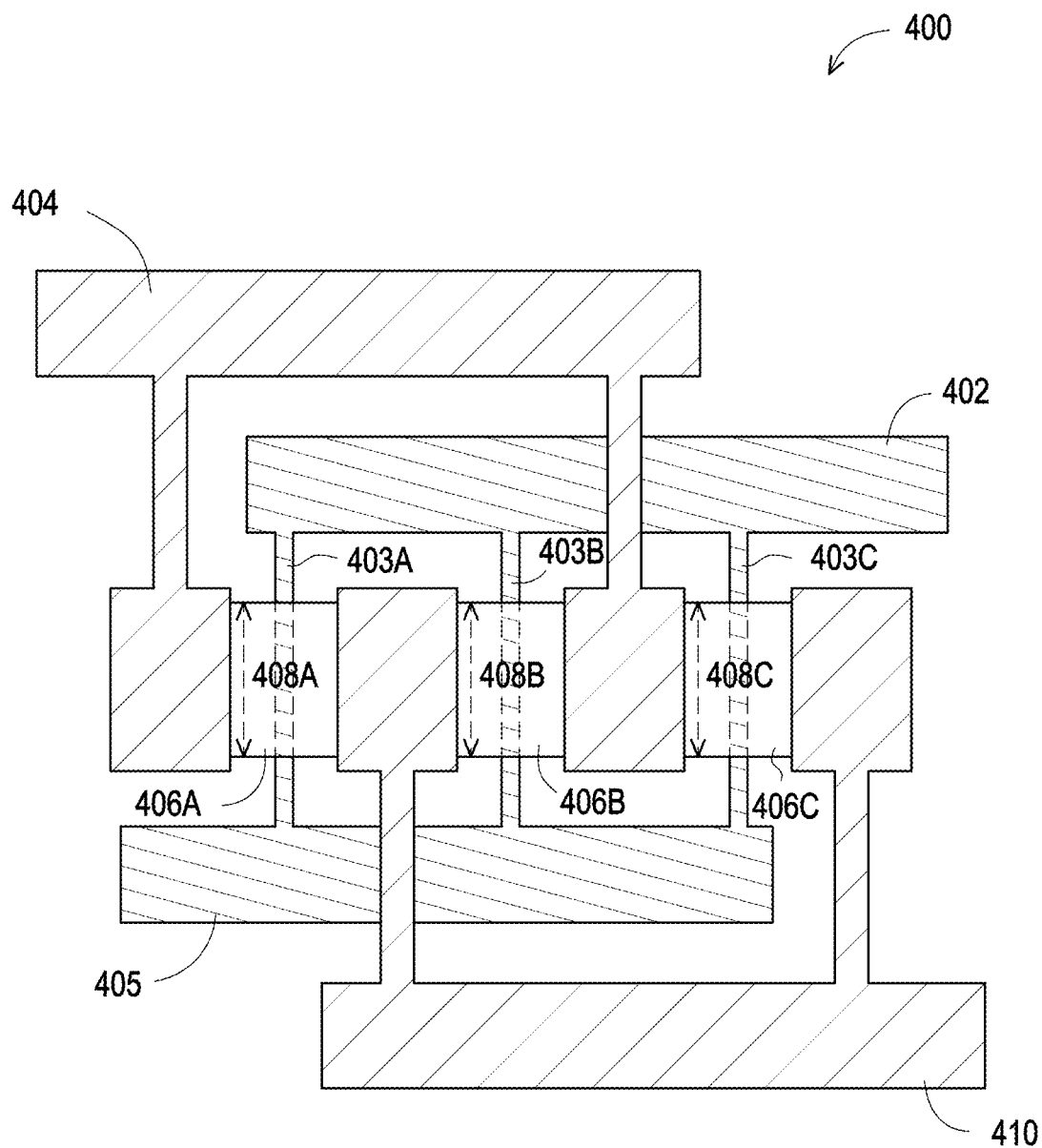
FIG. 4 illustrates a top view of an example shunt PCM switching device with shared contact pads, in accordance with some embodiments.
Figure 5:
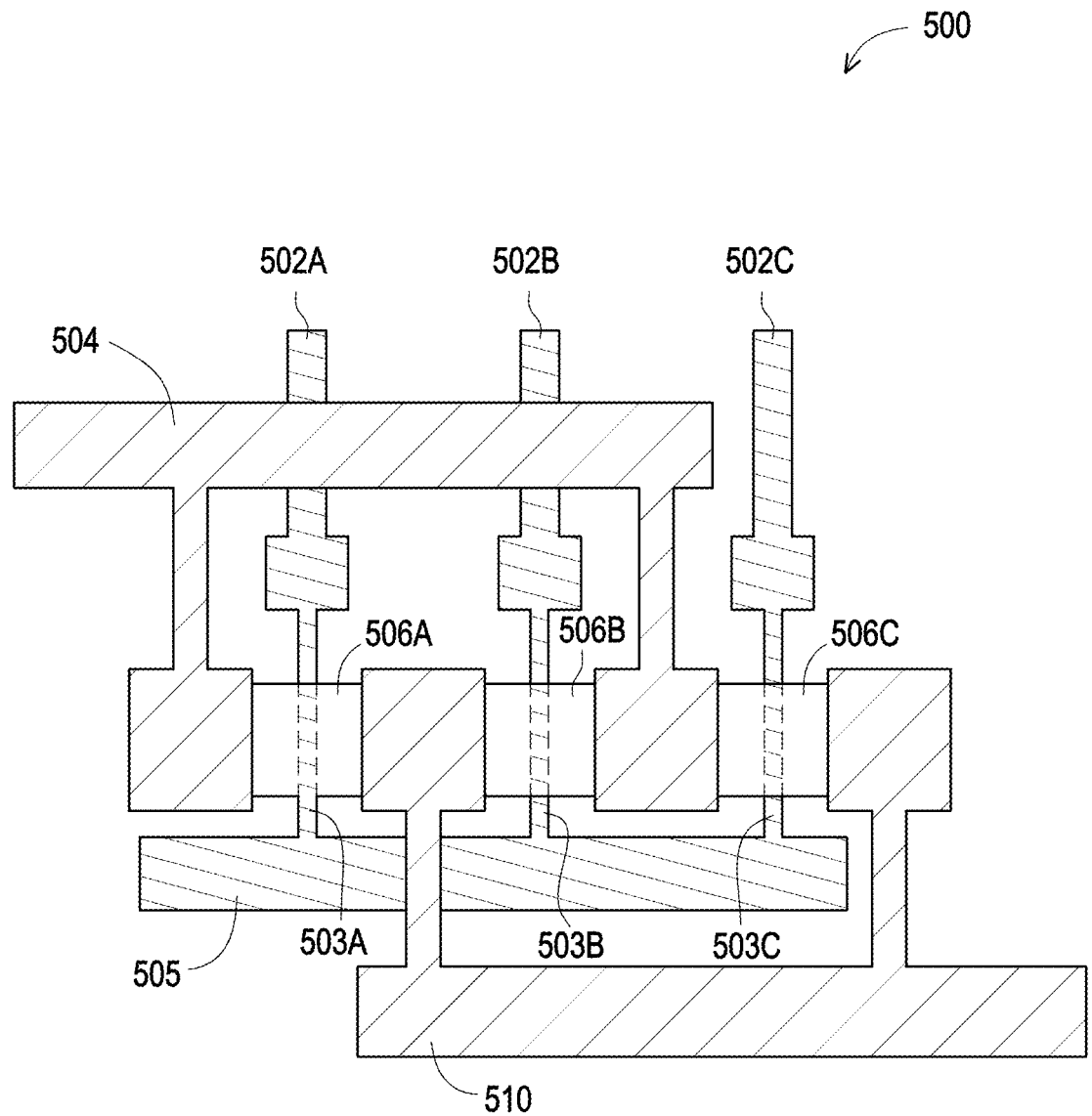
FIG. 5 illustrates a top view of an example shunt PCM switching device with shared contact pads and individual heater pads, in accordance with some embodiments.

The first, second, and third heaters (e.g., the first, second and third heaters 403A, 403B, and 403C of FIG. 4 or the first, second and third heaters 503A, 503B, and 503C of FIG. 5) can be formed on or defined in the substrate material using a material deposition process. For example, the heaters can be formed using any suitable material formation technique, including atomic layer deposition (ALD), a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. The first, second, and third heaters can be utilized to provide heat to a corresponding film of PCM, which is formed in later process steps. The heater can include any type of material having, for example, a low electrical resistivity and high melting point. Some example materials that may be used to fabricate the heaters include W, WN, TIN, NiSi, or the like.

In some embodiments, the heaters may be formed by etching corresponding trenches or portions of the substrate (e.g., the substrate 212), which can define the position and shape of the heaters. The trenches can be patterned, for example, using photolithographic techniques. The heater material can then be deposited in the formed trenches using a suitable material deposition technique, and a CMP process may be applied prior to further process steps. The heaters can be formed to have a thickness ranging from 300 to 2000 Angstroms, for example. Forming the heaters can include forming heater pads that can electrically couple the heaters to sources of electrical power, as described herein. Example heater pads extending from the ends of the heater 202 are shown in the top view 200A of FIG. 2A. The heaters can be formed with individual pads, as described in connection with FIG. 5, or can be formed with common pads, as described in connection with FIG. 4. Although the method 100 describes manufacturing three heaters, it should be understood that the present techniques may be utilized to fabricate shunt PCM devices with any number of heaters (and a corresponding number of PCM films, as described herein).

At operation 104, the method 100 includes forming at least one dielectric material over the first heater, the second heater, or the third heater. A cross-sectional view 200B of an element of a shunt PCM RF switch device (e.g., the devices shown in FIGS. 4 and 5, which include multiple elements) that includes a dielectric material 210 formed over the heater 202 is shown in FIG. 2B. The dielectric material can be any type of material with high thermal conductivity and good electrical isolation such as silicon carbide, silicon nitride, or aluminum nitride, or the like. The dielectric material can serve as a material that conducts heat between the heaters formed in operation 102 and the PCM film formed in later process steps. The dielectric material can be formed using any suitable material formation technique, including ALD, a high HDP-CVD, FCVD, the like, or combinations thereof.

Figure 3A:
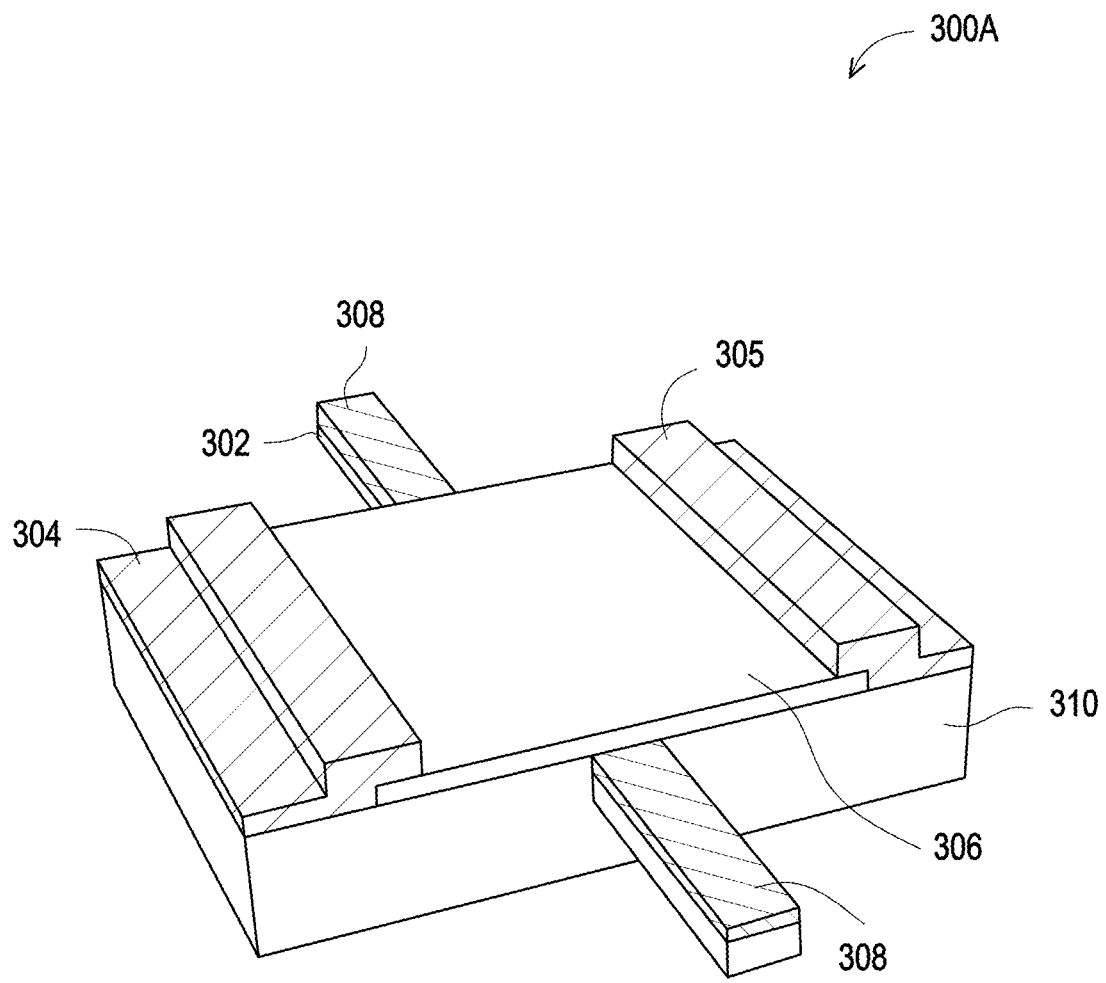
FIGS. 3A, 3B, 3C, and 3D illustrate perspective, top, and cross-sectional views respectively of an example element of a shunt PCM RF switching device defined in a substrate, in accordance with some embodiments.

The dielectric material can be formed to cover the length of a corresponding heater (e.g., between the heater and a PCM film). The dielectric material may be formed directly over, and at least partially share the dimensions or shape of, a corresponding heater. In some embodiments, the dielectric material may be formed in a trench in the substrate in which a corresponding heater was formed. An example depiction of an arrangement where the dielectric material is formed in a trench over a corresponding heater is shown in FIG. 3A (e.g., the dielectric material 308 formed in a trench in the substrate 310 over the heater 302). In some embodiments, the dielectric material may be formed by etching trenches or portions of the substrate and/or the heater material to define the position and shape of the dielectric material. As shown in the cross-sectional view 200B of FIG. 2B, the dielectric material 210 has been formed in a second trench formed over the heater 202 in the substrate 212.

Trenches used to form the dielectric material can be patterned, for example, using photolithographic techniques. The dielectric material \can then be deposited in the formed trenches using a suitable material deposition technique, and a CMP process may be applied prior to further process steps. The heaters can be formed to have a thickness ranging from 100 to 1000 Angstroms, for example. In some embodiments, an individual layer of heater material can be formed over each heater in a multi-film PCM switch device (e.g., the devices shown in FIGS. 4 and 5). In some embodiments, a single layer of dielectric material can be formed over all heaters in a multi-film PCM switch device. In some embodiments, no dielectric material is formed (e.g., the heater directly contacts the PCM film), and operation 104 is omitted from the method 100.

At operation 106, the method 100 includes forming a first film, a second film, and a third film. Each film can include a PCM material. The films can be formed, for example, using any suitable material formation technique, including ALD, a high HDP-CVD, FCVD, the like, or combinations thereof. Masking or photolithographic techniques may be utilized to define the area on which the films are deposited. The film can include phase change materials with a low resistivity, such as GeTe, SbTe, GST, In-doped PCM, Sb-doped PCM, the like, or combinations thereof. The films can be deposited to have a predetermined length, width, and thickness, which can be used to define the electrical characteristics of the films, as described herein. An example PCM film 206 formed on a single element of a shunt PCM device is shown in FIGS. 2A and 2B. Similar techniques can be used to form multiple PCM films 206 for each element in the shunt PCM switch devices (e.g., the PCM devices described in connection with FIGS. 4 and 5).

The films can be formed over each heater in the device formed in operation 102. The films can be positioned such that each heater is at least partially centered under a corresponding region of PCM film. The film can be separated from the heater by the dielectric material formed in operation 104, which can conduct heat from the heater to the films in order to change the phase of the PCM in the film. As described herein, applying heat to the film can cause the PCM to change phase, which alters the electrical characteristics (e.g., resistance, capacitance, etc.) of the film. As such, the films can operate as a heater-activated switch once contacts are formed on the film in further process steps.

At operation 108, the method 100 includes forming a first pad, a second pad, a third pad, and a fourth pad. The pads can be formed, for example, using any suitable material formation technique, including ALD, a high HDP-CVD, FCVD, the like, or combinations thereof. Masking or photolithographic techniques may be utilized to define the area on which the films are deposited. In an embodiment, the pads may be deposited in a single layer of material, and subsequently etched to define the individual pads, one or more of which may be electrically isolated from one another. The pads can be fabricated using any suitable material with low electrical resistivity such as W, WN, NiSi, Al, the like, or combinations thereof. The pads can be formed to have a thickness ranging from, for example, 300 to 2000 Angstroms.

In a multi-film device (e.g., the devices described in connection with FIGS. 4 and 5), some of the pads can overlap multiple regions of film in the device. As shown in FIG. 4, each film portion 408A, 408B, or 408C is in contact with a first portion of pad material 404 at one end and a second portion of pad material 410 at another end. The pad material 404 is formed to overlap corresponding ends of the film portions 408B and 408C, and one end of the film portion 408A, and the pad material 410 is formed to overlap corresponding ends of the film portions 408A and 408B, and one end of the film portion 408C. Overlapping the pads enables the device to operate using a shunt structure, which results in low-voltage operation and low on-resistance. Although only three film portions are shown in FIGS. 4 and 5, it should be understood that any number of film portions (and corresponding overlapping pads) may be utilized to achieve desired electrical characteristics for the device (e.g., a desired on-resistance, a desired off-capacitance, etc.).

FIGS. 2A and 2B illustrate a top view 200A and a cross-sectional view 200B, respectively, of an example element of a PCM device (e.g., a shunt PCM device described in connection with FIGS. 4 and 5), in accordance with some embodiments. The PCM device is defined in a substrate 212 (omitted from FIG. 2A, for visual clarity), which can be a semiconductor substrate, such as a bulk semiconductor, an SOI substrate, or the like, which may be doped (e.g., with a p-type or an n-type dopant) or undoped. The substrate 212 may be a wafer, such as a silicon wafer. In some embodiments, the semiconductor material of the substrate 212 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in the cross-sectional view 200B, a heater 202 is defined in the substrate. The heater can be utilized to provide heat to the film 206, which includes a PCM. The heater can include any type of material having, for example, a low electrical resistivity and high melting point. Some example materials that may be used to fabricate the heaters include W, WN, TiN, NiSi, or the like. In this example, the heater is defined in a recessed portion of the substrate 212, and is in contact with the substrate 212 and a layer of a dielectric material 210 (also omitted from the top view 200A of FIG. 2A, for visual clarity). The heater can be formed such that it is centered beneath the film that includes the PCM material, and between the pads 204 and 205 of the device. The heater 202 may have a predetermined length, width, and thickness in the regions beneath the film 206, as shown in the top view 200A, and may expand into larger contacts, as shown in FIG. 2A. The heater 202 may be formed from a single layer of material, for example. The heater 202 can be formed to have a thickness ranging from 300 to 2000 Angstroms.

The layer of dielectric material 210 can conduct heat between the heater and the PCM film 206. The dielectric material can be any type of material with high thermal conductivity and good electrical isolation such as silicon carbide, silicon nitride, or aluminum nitride, or the like. In the example shown in the cross-sectional view 200B of FIG. 2B, the dielectric material 210 is formed on top of the heater in a recessed portion of the substrate 212. As shown, the dielectric material 210 has dimensions that extend beyond the width of the heater 202 and the PCM film 206. In some embodiments, the dielectric material 210 may have dimensions that correspond to those of the heater 202 (e.g., similar to the dielectric material 308 and the heater 302 of FIG. 3A).

The PCM film 206 can include any suitable PCM with a low resistivity, such as GeTe, SbTe, GST, In-doped PCM, Sb-doped PCM, the like, or combinations thereof. The films can be deposited to have a predetermined width 208, length 214, and thickness (e.g., ranging from 300 to 1500 Angstroms, etc.), which can be used to define the electrical characteristics of the film 206. As described herein, there is a trade-off between the performance of the device and the write voltage of the film. The PCM resistance (e.g., the on-resistance) is determined by the length 214, the width 208, and the thickness of the PCM film. The write voltage or power strongly depends on PCM volume and heater length, because the write power of the device $P=V^2/R$. When selecting the dimensions for the film, a large width 208 is favorable to reduce the resistance of the PCM, and provides low on-resistance, which improves overall device performance. However, a larger width 208 requires a longer heater 202 length. As the length of the heater 202 increases, so does the resistance of the heater resistance. Based on the relationship above, this increases the overall write voltage for PCM switching. One advantage of the shunt PCM devices described in connection with FIGS. 4 and 5 is that their parallel heaters provide low on-resistance, and therefore low-voltage operation.

The pads 204 and 205 can be RF pads that carry an RF signal relative to one another. For example, each pad can have a different voltage during device operation, and the varying resistance of the PCM film 206 can operate as a switch. The pads 204 and 205 can be fabricated using any suitable material with low electrical resistivity such as W, WN, NiSi, Al, the like, or combinations thereof. The pads can be formed to have a thickness ranging from, for example, 300 to 2000 Angstroms. As shown, the pads 204 and 205 can partially overlap a portion of the PCM film 206. The pads can be formed on the PCM film 206 and the substrate 212, for example, using any suitable material formation technique, including ALD, a high HDP-CVD, FCVD, the like, or combinations thereof.

FIGS. 3A, 3B, 3C, and 3D illustrate perspective, top, and cross-sectional views respectively of an example element of a shunt PCM device (e.g., the shunt PCM devices described in connection with FIGS. 4 and 5) defined in a substrate, in accordance with some embodiments. FIG. 3A shows a perspective view 300A of an example element of a shunt PCM device that is similar to the element of the shunt PCM device shown in FIGS. 2A and 2B. Multiple elements are formed to create the shunt PCM devices described herein (e.g., the PCM devices 400 and 500 of FIGS. 4 and 5, respectively). The heater 302 may be similar to, and include any of the structure of, the heater 202 of FIGS. 2A and 2B, the substrate 310 may be similar to the substrate 212, the PCM film 306 may be similar to the PCM film 206, and the pads 304 and 305 may be similar to the pads 204 and 205, respectively. One difference between the PCM device in FIGS. 2A and 2B and the PCM device in FIG. 3A is the dielectric material 308 has been formed to correspond to the dimensions of the heater 302. As shown, the dielectric material 308 is formed on the heater 302 in the same recessed portion of the substrate 310.

Figure 3B:
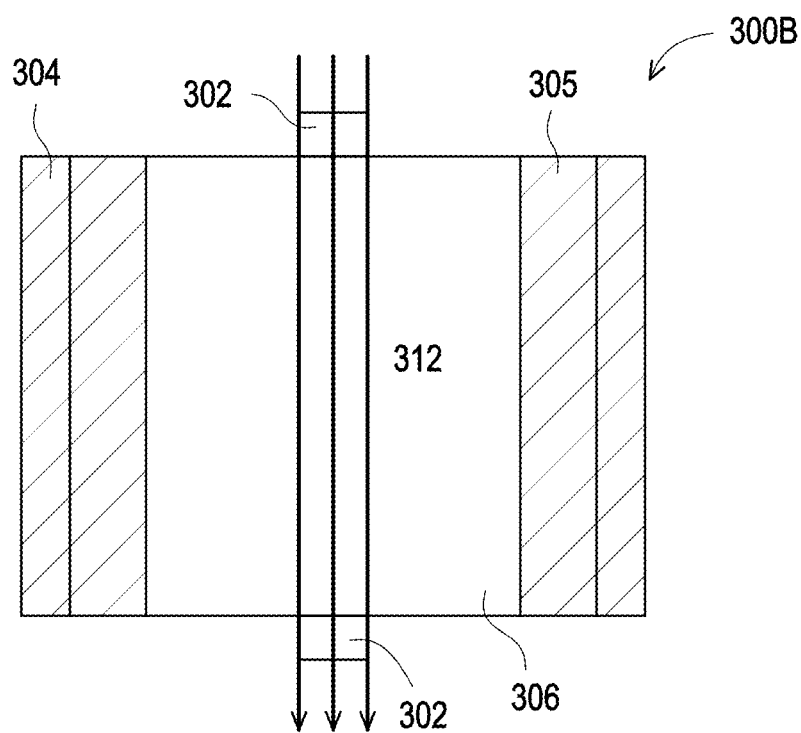
Figure 3C:
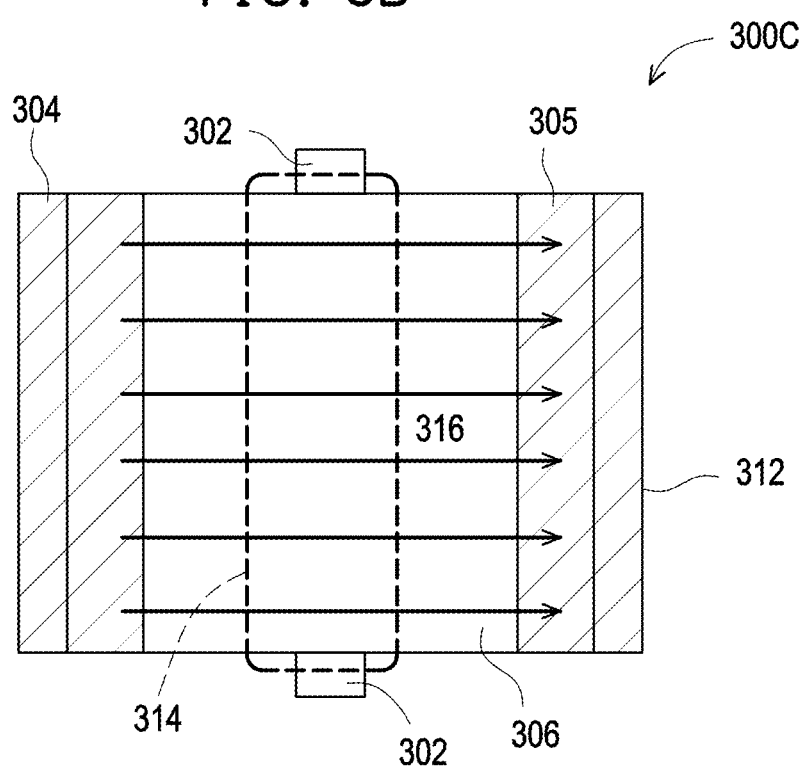

FIGS. 3B and 3C show top views 300B and 300C of the device of FIG. 3A during write and read operations, respectively. During a read operation, a bias voltage can be applied across the heater 302 to generate a high temperature (e.g., in the direction indicated by the arrows 312). The heat generated by the heater 302 is transmitted to the PCM film 306 through the dielectric material 308 (not shown in FIGS. 3B and 3C for visual clarity). As the temperature of the PCM film 306 reaches a certain threshold, the phase (and the electric characteristics) of the PCM film 306 are changed accordingly. During a read operation, a voltage is applied across the PCM film 306 in the direction indicated by the arrows 316 (e.g., across the pads 304 and 305). Current passing through the PCM material passes through the active region 314 of the PCM film 306 (e.g., the area activated by the heater 302).

Figure 3D:
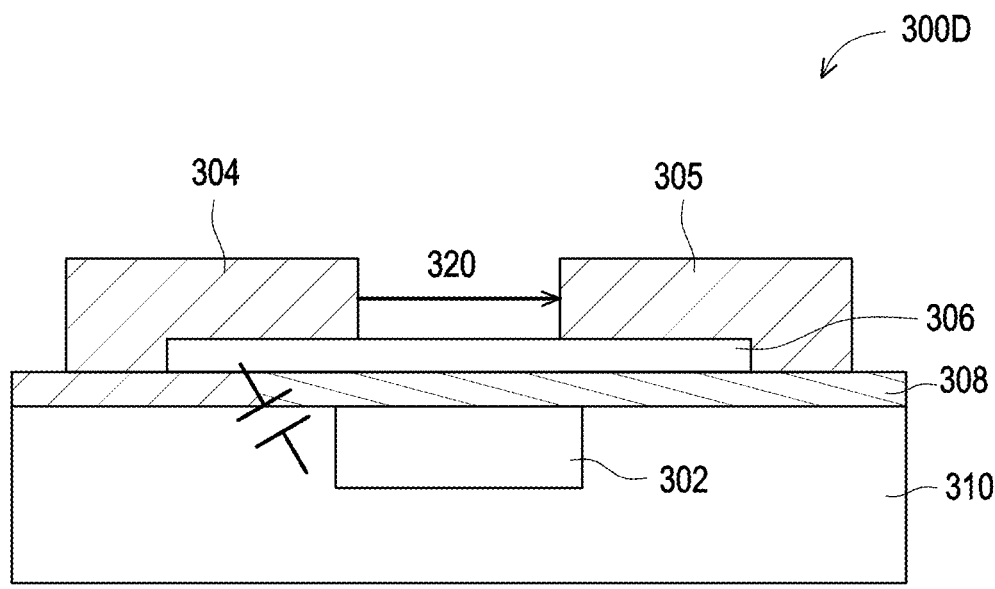
Figure 3E:
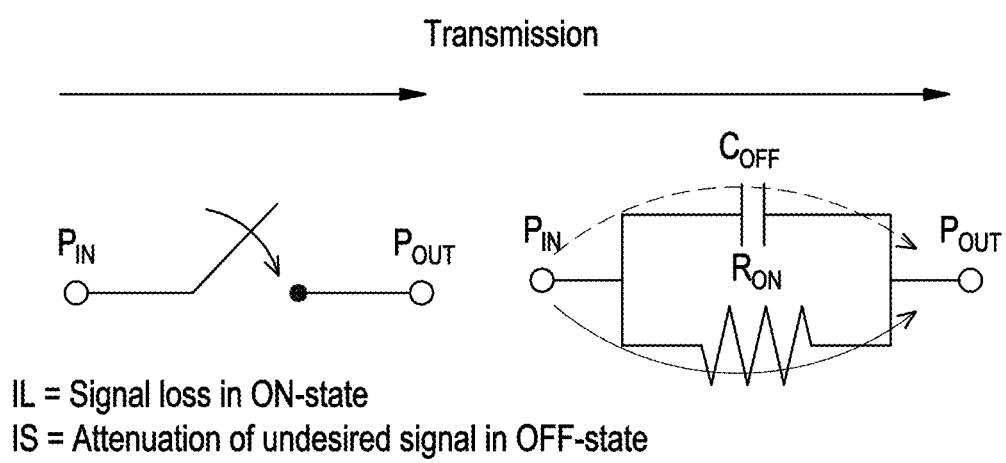
FIG. 3E shows an example circuit diagram of the PCM switching devices described herein in both an on-state and an off-state, in accordance with some embodiments.

FIG. 3D shows a cross-sectional view 300D of a device similar to that shown in FIGS. 3A, 3B, and 3C, but with the layer of the dielectric material 308 extending across the surface of the device, rather than being confined to the dimensions of the heater 302. The cross-sectional view 300D is a view of the device looking along the length of the heater 302, which as shown is positioned between the pads 304 and 305. Depending on the state of the PCM film 306, current 320 can either flow through the PCM film 306 (e.g., experience on-resistance), or experience capacitance between the pads 304 and 305 (e.g., off-capacitance). The device performance, or figure-of-merit (FOM), can be quantified as a function of the on-resistance and off-capacitance of the device, which respectively represent the ability to pass current when the switch is on, and the ability to attenuate unwanted signals when the device is off. A circuit diagram showing the switch device of FIG. 3D in both on and off states is shown in FIG. 3E. In an embodiment, the FOM of the device can be quantified as about $1/(2\pi RC)$, where R is the on-resistance of the device and C is the off-capacitance of the device. A high-performance device will have a low on-resistance and a high off-capacitance.

FIG. 4 illustrates a top view 400 of an example parallel PCM switching device with shared contact pads, in accordance with some embodiments. The device shown in FIG. 4 utilizes overlapping pads to reduce the overall area of a parallel PCM RF switching device, and to reduce overall device complexity. As shown in the top view 400, the device includes multiple PCM films 406A, 406B, and 406C (sometimes collectively referred to as the "PCM films 406"), which may be similar to the PCM films 206 described in connection with FIGS. 2A and 2B. The device of FIG. 4 includes RF pads 404, portions of which overlap the end of the PCM film 406A and the ends of the PCM films 406B and 406C, as shown. The device in the top view 400 includes the RF pads 410, portions of which overlap the end of the PCM film 406C and the ends of the PCM films 406A and 406A, as shown. The RF pads 404 and 410 may be similar to the RF pads 204 and 205 described in connection with FIGS. 2A and 2B.

Common alternating RF pads 404 and 410, as shown, reduce the RF pad area relative to the alternative approaches illustrated in FIGS. 4 and 5, and minimize extra parasitic effect on the RF switch performance. The alternating pads further simplify the complexity of the logical circuitry required to operate the device shown in FIG. 4. In addition, the device, as shown, is symmetrical, which can simply the use of complex logical circuits. The respective widths 408A, 408B, and 408C of the PCM films 406A, 406B, and 406C provide relatively low on-resistance during device operation. The parallel design of the heaters enables low voltage to drive the respective heaters 403A, 403B, and 403C, further increasing the performance of the device.

The heaters 403A, 403B, and 403C (sometimes collectively referred to as the "heaters 403") may each be similar to the heater 202 described in connection with FIGS. 2A and 2B. As shown, the heaters 403A, 403B, and 403C are each positioned about center beneath the respective PCM films 406A, 406B, and 406C, and extend parallel to and between the alternating RF pads 404 and 410. Although not shown here for visual clarity, one or more portions of dielectric material may be disposed between each of the heaters 403 and their respective PCM films 406, which can conduct heat from the heaters 403 to their respective PCM films 406. The heaters 403 can each share heater pads 402 and 405, each of which can be electrically coupled to different voltages (e.g., a positive voltage source and ground). This causes each of the heaters 403 to be in parallel, making their effective resistance about one third of their individual resistance, thereby reducing the voltage requirement to operate the device. The heater pads 402 and 405 can include the same material as the heaters 403. Although three PCM films 406 with overlapping RF pads 404 and 410 are shown here, it should be understood that any number of PCM films 406 (and corresponding heaters 403) can be defined in the devices to achieve a desired on resistance. The same overlapping and alternating arrangement of the RF pads 404 and 410 over the PCM films 406 can be extended to any number of PCM films 406.

FIG. 5 illustrates a top view 500 of an example parallel PCM switching device with shared contact pads and individual heater pads, in accordance with some embodiments. The device shown in FIG. 5 can be similar to the device shown in FIG. 4. For example, the heaters 503A, 503B, and 503C can be similar to the heaters 403A, 403B, and 403C, the RF pads 504 and 510 can be similar to the RF pads 404 and 410, and the PCM films 506A, 506B, and 506C (sometimes collectively referred to as the "PCM films 506") can be similar to the PCM films 406A, 406B, and 406C. In the embodiment shown in FIG. 5, each of the heaters shares a common heater pad 505 (which can be similar to the heater pad 405). In addition, each of the heaters 503A, 503B, and 503C has their own respective heater pad 502A, 502B, and 502C. The heater pads 502A, 502B, and 502C may each be electrically coupled to different voltage sources. In addition, although the size of each of the PCM films 506 (or the PCM films 406 of FIG. 4) are shown as having about the same size, it should be understood that the dimensions of the PCM films 506 and the PCM films 406 (and the corresponding heaters 403 or 503) may each have different sizes to achieve a desired on-resistance and off-capacitance.

Figure 6:
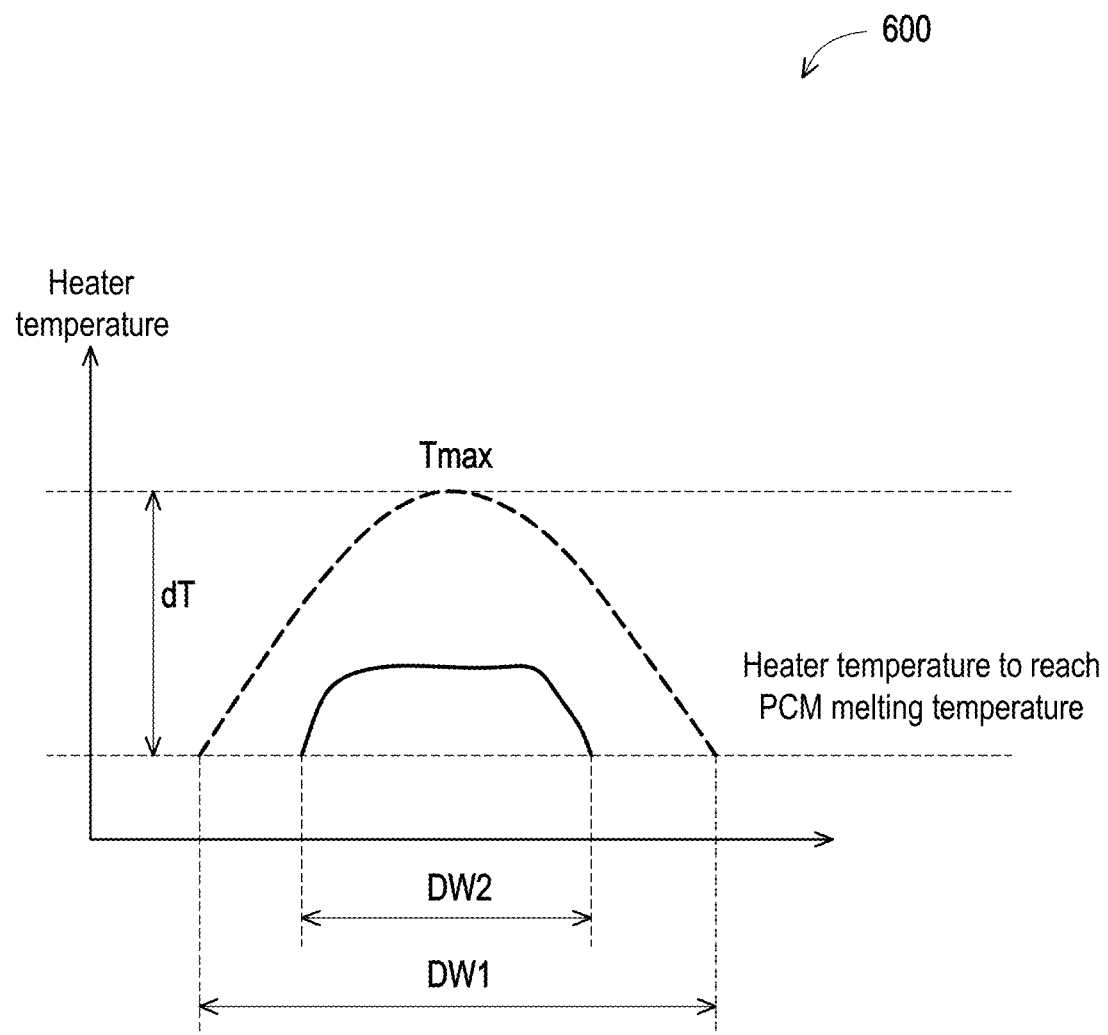
FIG. 6 illustrates an example graph showing an example relationship between a required heater temperature and the dimensions of a phase-change material, in accordance with some embodiments.

FIG. 6 illustrates an example graph 600 showing an example relationship between a required heater temperature and the dimensions of a phase-change material, in accordance with some embodiments. In the graph 600, DW1 and DW2 refer to different widths of a PCM film (e.g., the width 208 of FIG. 2A), each of which require a corresponding length of heater material. In the graph 600, the width DW1 of an example device is greater than the width DW2. As described herein, a greater PCM film width requires a greater length of heater material. As shown, a device having a longer PCM film width requires a greater heater temperature in order to achieve the corresponding PCM melting temperature. Operating a device with multiple PCM films in parallel (e.g., with PCM film width DW2) reduces the heater temperature (and driving voltage) required to reach the PCM melting point, as shown, relative to an alternative device with a width of DW1.

Figure 7:
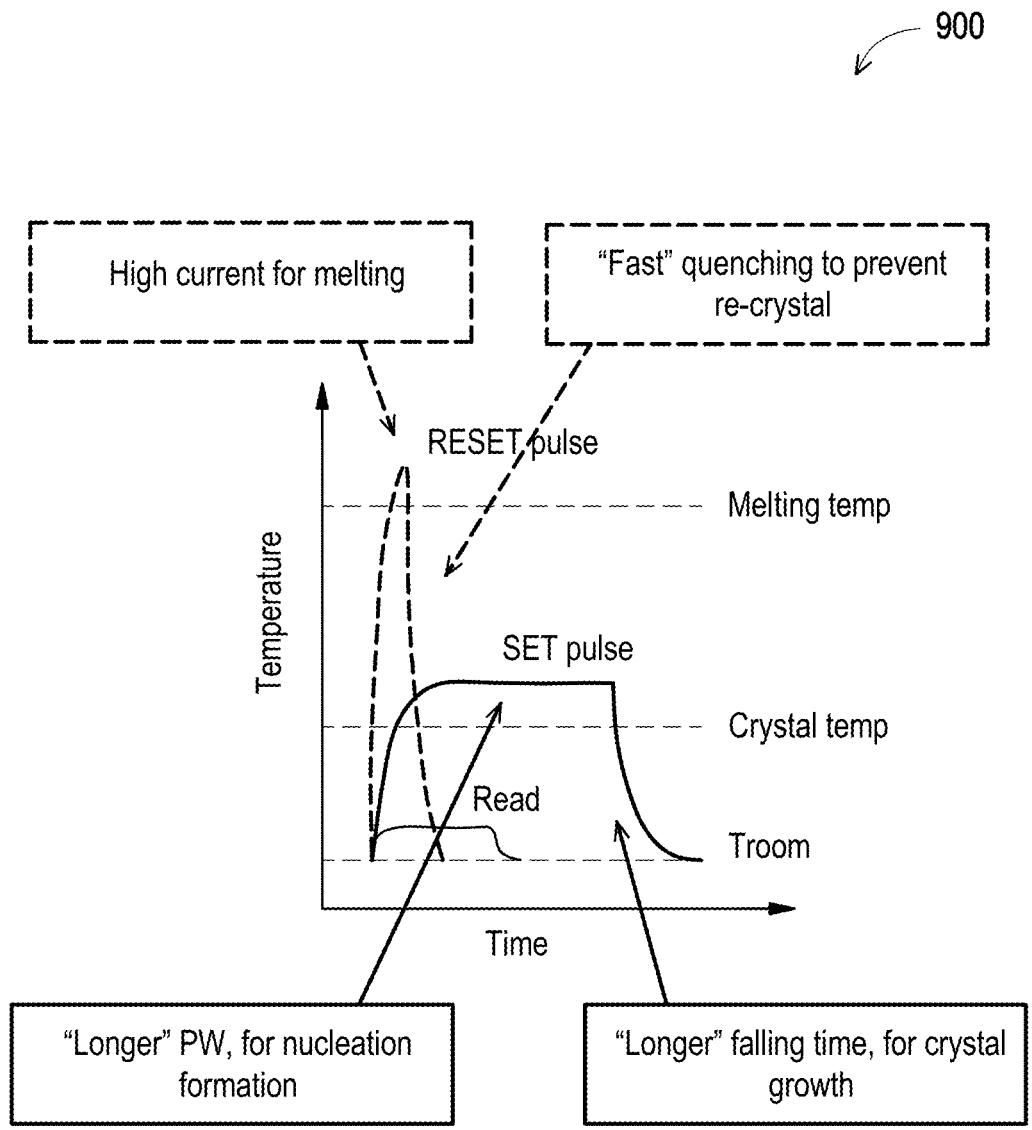
FIG. 7 illustrates an example graph showing different temperature profiles for different operations of phase change memory utilizing PCM, in accordance with some embodiments.

FIG. 7 illustrates an example graph 700 showing different temperature profiles for different operations for phase change memory, in accordance with some embodiments. In brief overview, phase change memory (PCRAM) SET and RESET operations are driven by "Temperature" inside the material. Temperature is generated through "joule heating" which is controlled by current pulses through the heater(s) of the device with varying pulse width and falling time. The graph 700 shows that for a RESET operation, a short burst of high current is used to bring the PCM film above the melting temperature. For a SET operation, current is passed through the heater to maintain a temperature that is above the crystal temperature, but below the melting temperature, for a period of time that is longer than the RESET operation. The SET pulse is longer to enable nucleation formation in the PCM film, and the temperature has a longer fall time than the RESET operation to enable crystal growth in the PCM film. In a read operation, the temperature of the PCM film rises above room temperature, but does not reach the crystal temperature of the PCM film.

Figure 8:
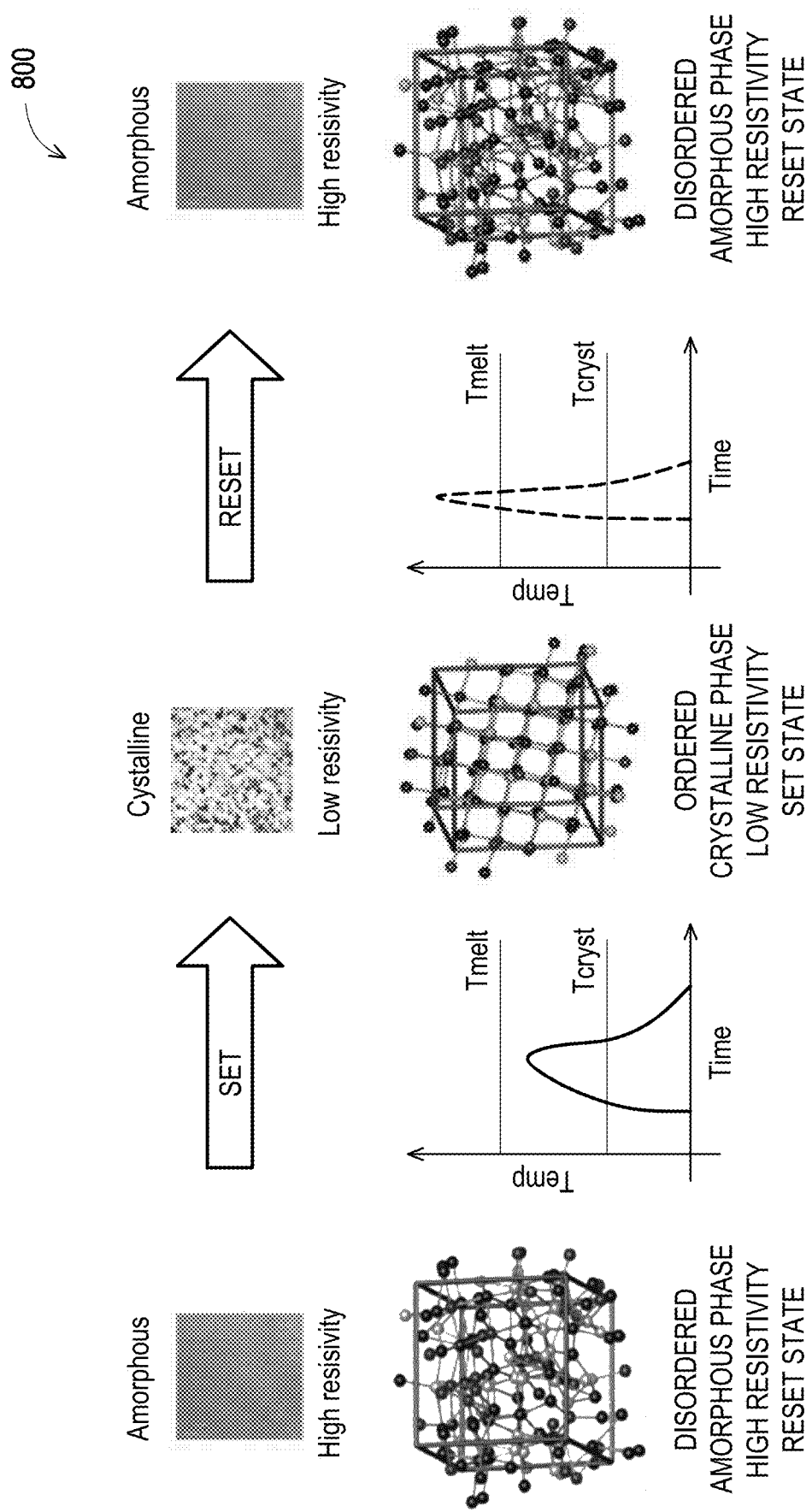
FIG. 8 illustrates example diagrams of phases of a PCM that change in response to different temperature profiles, in accordance with some embodiments.

FIG. 8 illustrates an example diagram 800 of different phases of a PCM in response to exposure to different temperature profiles, in accordance with some embodiments. As shown, in the amorphous phase (e.g., after a RESET operation), the PCM has a disordered structure at the atomic level, and exhibits high resistivity. Upon applying an appropriate temperature change (e.g., using a heater as described in connection with FIG. 7) for a SET operation, the PCM is ordered into a crystalline phase, which exhibits low resistivity. Once in the crystalline state, an appropriate temperature for a RESET operation can be applied to cause the PCM to revert to the amorphous phase, having high resistivity. Changing the resistivity of the PCM film can cause the PCM to operate as an insulator (e.g., in the amorphous phase) or a conductor (e.g., in the crystalline phase), enabling the various devices described herein to operate as switches.

In one aspect of the present disclosure, a semiconductor device is disclosed. The semiconductor device includes a first film and a second film arranged with respect to one another along a first lateral direction. Each of the first and second films include a PCM. The semiconductor device includes a first metal pad, a second metal pad, and a third metal pad. The first and second metal pads are disposed over ends of the first film, respectively, and the second and third metal pads are disposed over ends of the second film, respectively. The semiconductor device includes a first heater and a second heater extending along a second lateral direction. The first heater is disposed below the first film and between the first and second metal pads and the second heater is disposed below the second film and between the second and third metal pads.

In another aspect of the present disclosure, a semiconductor device is disclosed. The semiconductor device includes a plurality of films arranged with respect to one another along a first lateral direction, each of the plurality of films comprising a PCM. The semiconductor device can include at least one pad that overlaps ends of two of the plurality of films. The semiconductor device can include a plurality of heaters that extend along a second lateral direction. Each of the plurality of heaters is disposed below a respective one of the plurality of films.

In yet another aspect of the present disclosure, a method for manufacturing semiconductor devices is disclosed. The method includes forming a first heater and a second heater in a substrate, each of the first heater and the second heater extending along a first lateral direction. The method includes forming a first film and a second film on the substrate arranged with respect to one another along the first lateral direction, wherein each of the first and second films include a PCM. Each of the first film and the second film are positioned respectively above the first heater and the second heater. The method includes forming a first metal pad, a second metal pad, and a third metal pad. The first and second metal pads are formed over ends of the first film, respectively, and the second and third metal pads are formed over ends of the second film, respectively.

As used herein, the terms "about" and "approximately" generally mean plus or minus 10% of the stated value. For example, about 0.5 would include 0.45 and 0.55, about 10 would include 9 to 11, about 1000 would include 700 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first film and a second film arranged with respect to one another along a first lateral direction, wherein each of the first and second films include a phase change material (PCM);
a first metal pad, a second metal pad, and a third metal pad, wherein the first and second metal pads are disposed over ends of the first film, respectively, and the second and third metal pads are disposed over ends of the second film, respectively; and
a first heater and a second heater extending along a second lateral direction, wherein the first heater is disposed below the first film and between the first and second metal pads and the second heater is disposed below the second film and between the second and third metal pads.

2. The semiconductor device of claim 1, further comprising a dielectric layer interposed between the first and second films and the first and second heaters, and configured to thermally couple the first and second heaters to the first and second films, respectively.

3. The semiconductor device of claim 2, wherein the dielectric layer includes a material selected from a group consisting of silicon nitride, aluminum nitride, and combinations thereof.

4. The semiconductor device of claim 1, wherein the first and third metal pads are connected to a first voltage, and the second metal pad is connected to a second voltage.

5. The semiconductor device of claim 4, wherein an equivalent resistance between the first voltage and the second voltage is inversely proportional to a number of the first and second films.

6. The semiconductor device of claim 1, wherein the first and second heaters include a material selected from a group consisting of tungsten, tungsten nitride, titanium nitride, nickel silicide, and combinations thereof.

7. The semiconductor device of claim 1, wherein the first and second heaters have their respective first ends connected to one another, and their respective second ends connected to one another.

8. The semiconductor device of claim 1, further comprising:
a third film arranged with the first and second films along the first lateral direction, a fourth metal pad, and a third heater extending with the first and second heaters along the second lateral direction;
wherein the third and fourth metal pads are disposed over ends of the third film, respectively; and
wherein the third heater is disposed below the third film and between the third and fourth metal pads.

9. The semiconductor device of claim 1, wherein each of the first and second films are configured to transition between a first resistance state and a second resistance state based on an amount of heat received by a corresponding one of the first to third heaters.

10. The semiconductor device of claim 1, wherein the PCM is selected from a group consisting of germanium telluride (GeTe), antimony telluride (SbTe), germanium-antimony-tellurium (GST), indium-doped PCM, antimony-doped PCM, and combinations thereof.

11. A semiconductor device, comprising:
a plurality of films arranged with respect to one another along a first lateral direction, each of the plurality of films comprising a phase change material (PCM);
at least one pad that overlaps ends of two of the plurality of films; and
a plurality of heaters that extend along a second lateral direction, each of the plurality of heaters disposed below a respective one of the plurality of films.

12. The semiconductor device of claim 11, further comprising a dielectric layer interposed between a heater of the plurality of heaters and a respective film of the plurality of films.

13. The semiconductor device of claim 12, wherein the dielectric material includes a material selected from a group consisting of silicon nitride, aluminum nitride, and combinations thereof.

14. The semiconductor device of claim 11, further comprising a second pad coupled to at least one end of at least one of the plurality of films, wherein the at least one pad is connected to a first voltage and the second pad is connected to a second voltage.

15. The semiconductor device of claim 11, wherein each of the plurality of heaters comprises a respective first end and a respective second end, and wherein the respective first end of each of the plurality of heaters are connected to one another.

16. The semiconductor device of claim 15, wherein the respective second end of each of the plurality of heaters are connected to one another.

17. The semiconductor device of claim 11, wherein the PCM is selected from a group consisting of germanium telluride (GeTe), antimony telluride (SbTe), germanium-antimony-tellurium (GST), indium-doped PCM, antimony-doped PCM, and combinations thereof.

18. A method for manufacturing semiconductor devices, comprising:
forming a first heater and a second heater in a substrate, each of the first heater and the second heater extending along a first lateral direction;
forming a first film and a second film on the substrate arranged with respect to one another along the first lateral direction, wherein each of the first and second films include a phase change material (PCM), each of the first film and the second film positioned respectively above the first heater and the second heater; and
forming a first metal pad, a second metal pad, and a third metal pad, wherein the first and second metal pads are formed over ends of the first film, respectively, and the second and third metal pads are formed over ends of the second film, respectively.

19. The method of claim 18, wherein forming the first metal pad, the second metal pad, and the third metal pad comprises forming a first radio-frequency (RF) pad electrically coupled to the first metal pad and the third metal pad, and a second RF pad electrically coupled to the second metal pad.

20. The method of claim 18, further comprising:
forming a third heater in the substrate, the third heater extending with the first and second heaters along the first lateral direction;

forming a third film on the substrate arranged with the first and second films along the first lateral direction, the third film positioned above the third heater; and forming a fourth metal pad, wherein the third and fourth metal pads are formed over ends of the third film, respectively.

\* \* \* \* \*